United States Patent
Fischer et al.

(10) Patent No.: US 7,317,603 B2
(45) Date of Patent: Jan. 8, 2008

(54) INTEGRATED CIRCUIT WITH ELECTROSTATIC DISCHARGE PROTECTION

(75) Inventors: Helmut Fischer, Oberhaching (DE); Jürgen Lindolf, Friedberg (DE); Michael Bernhard Sommer, Raubling (DE)

(73) Assignee: Infineon Technologies, AG, Neubiberg (DE)

(*) Notice: Subject to any disclaimer, the term of this patent is extended or adjusted under 35 U.S.C. 154(b) by 92 days.

(21) Appl. No.: 11/389,540

(22) Filed: Mar. 27, 2006

(65) Prior Publication Data

US 2006/0232897 A1    Oct. 19, 2006

Related U.S. Application Data

(63) Continuation of application No. PCT/DE04/02098, filed on Sep. 20, 2004.

(30) Foreign Application Priority Data

Sep. 26, 2003  (DE)  ................................ 103 44 872

(51) Int. Cl.
    *H02H 9/00*  (2006.01)
(52) U.S. Cl. ........................................ 361/56
(58) Field of Classification Search ................... 361/56
    See application file for complete search history.

(56) References Cited

U.S. PATENT DOCUMENTS 5,365,546 A * 11/1994 Koenck et al. ............. 375/223
5,515,232 A * 5/1996 Fukazawa et al. .......... 361/111
5,610,790 A    3/1997 Staab et al. ................. 361/56
5,793,588 A    8/1998 Jeong ........................... 361/36
5,956,277 A * 9/1999 Roohparvar ................ 365/201
6,201,747 B1   3/2001 Venkatesh et al. .......... 765/201
6,671,146 B1  12/2003 Hashimoto et al. .......... 361/56

OTHER PUBLICATIONS

Voldmann S., et al.; "Dynamic threshold body-and gate-coupled SOI ESD protection networks"; Journal of Electrostatics 44, Sep. 1998, pp. 239-255.

* cited by examiner

Primary Examiner—Stephen W. Jackson
(74) Attorney, Agent, or Firm—Edell, Shapiro & Finnan, LLC

(57) ABSTRACT

An integrated circuit with electrostatic discharge protection includes a first transistor with a source terminal, a drain terminal and a gate terminal, and a second transistor with a source terminal, a drain terminal and a gate terminal. The gate terminal for each of the first and second transistors is connected to the drain terminal. The first transistor is connected in series with the second transistor by one of the drain and source terminals of the first transistor being connected to one of the drain and source terminals of the second transistor. The series circuit formed by the transistors is connected to an input terminal of the integrated circuit or to a supply terminal and a terminal that applies the reference potential of the integrated circuit. The series circuit of the transistors is dimensioned by the number of transistors and the setting of the channel length and channel width ratios of the transistors.

12 Claims, 8 Drawing Sheets

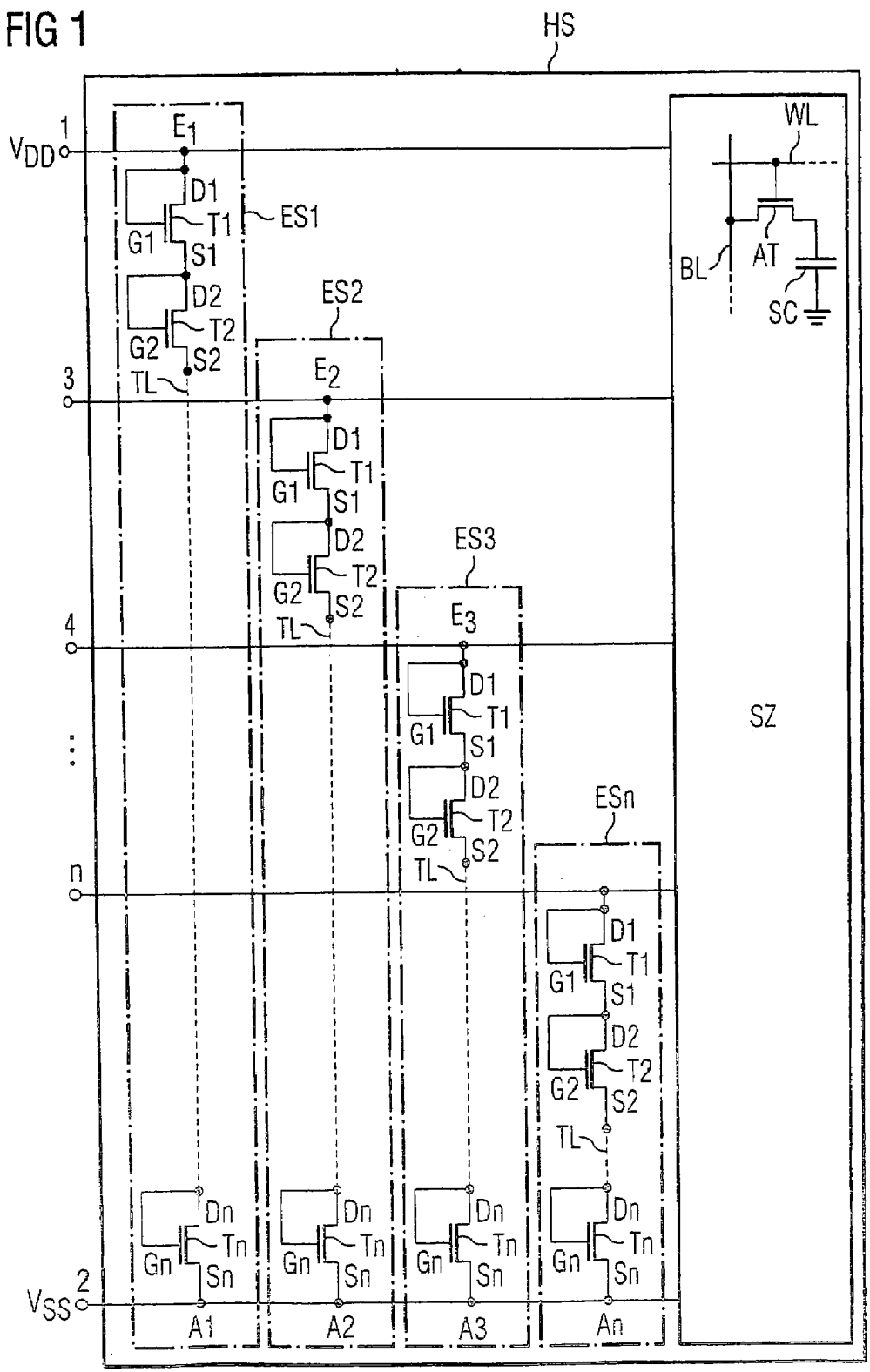

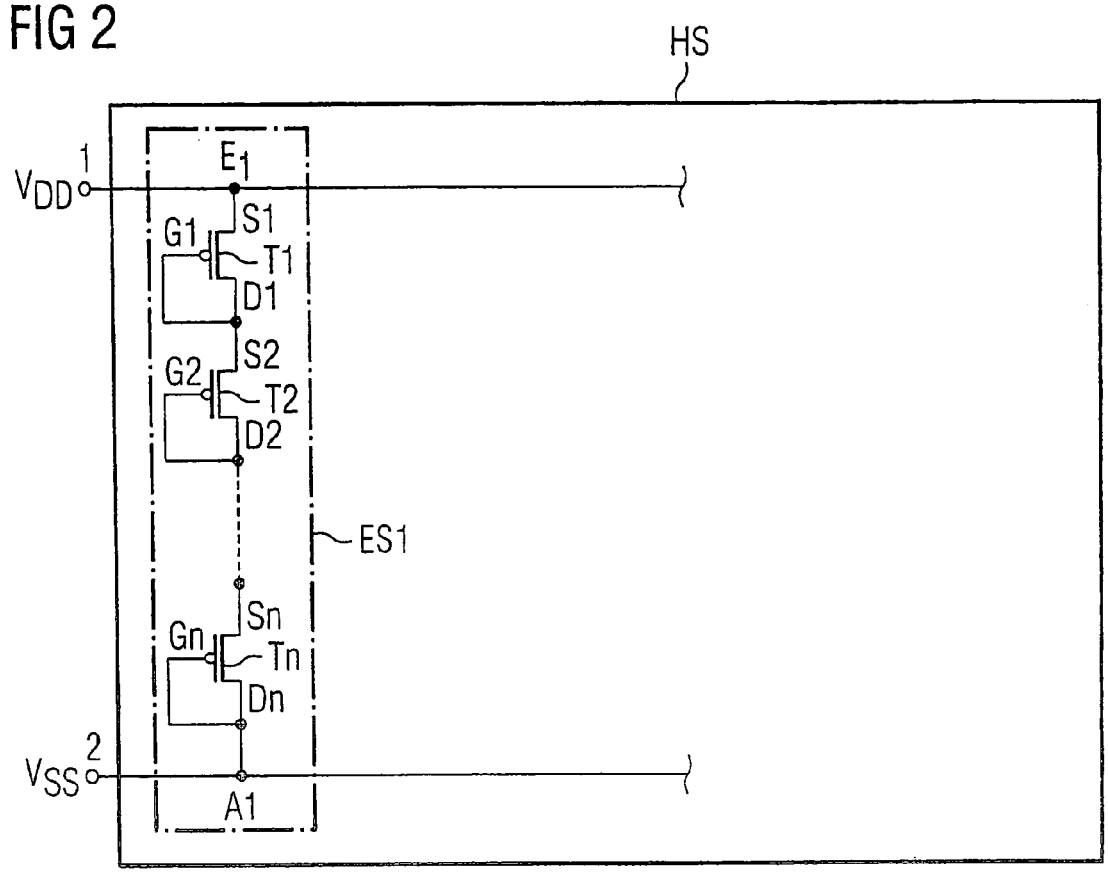

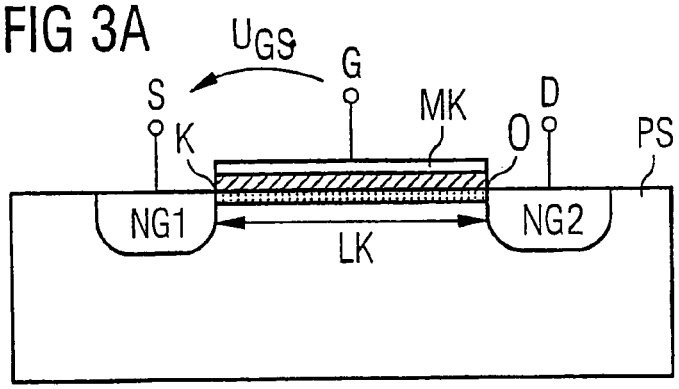
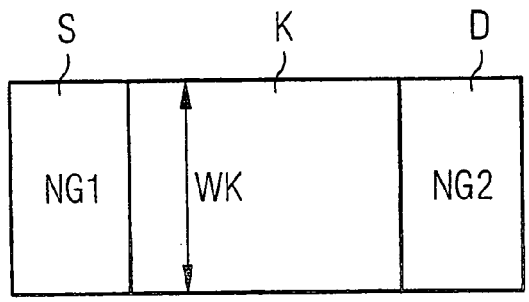
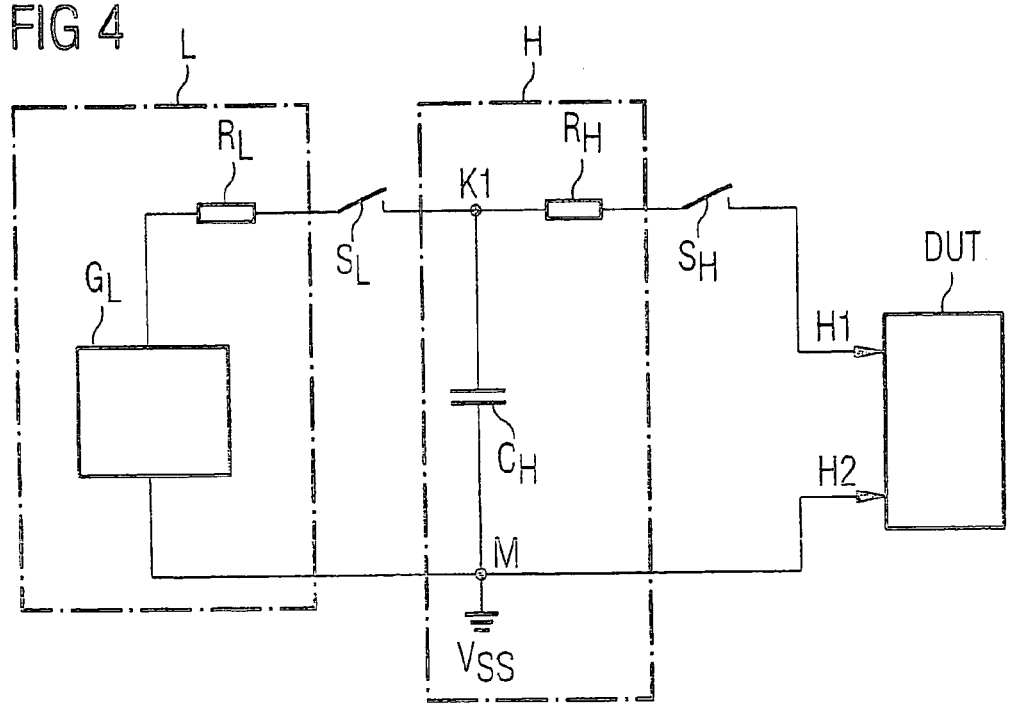

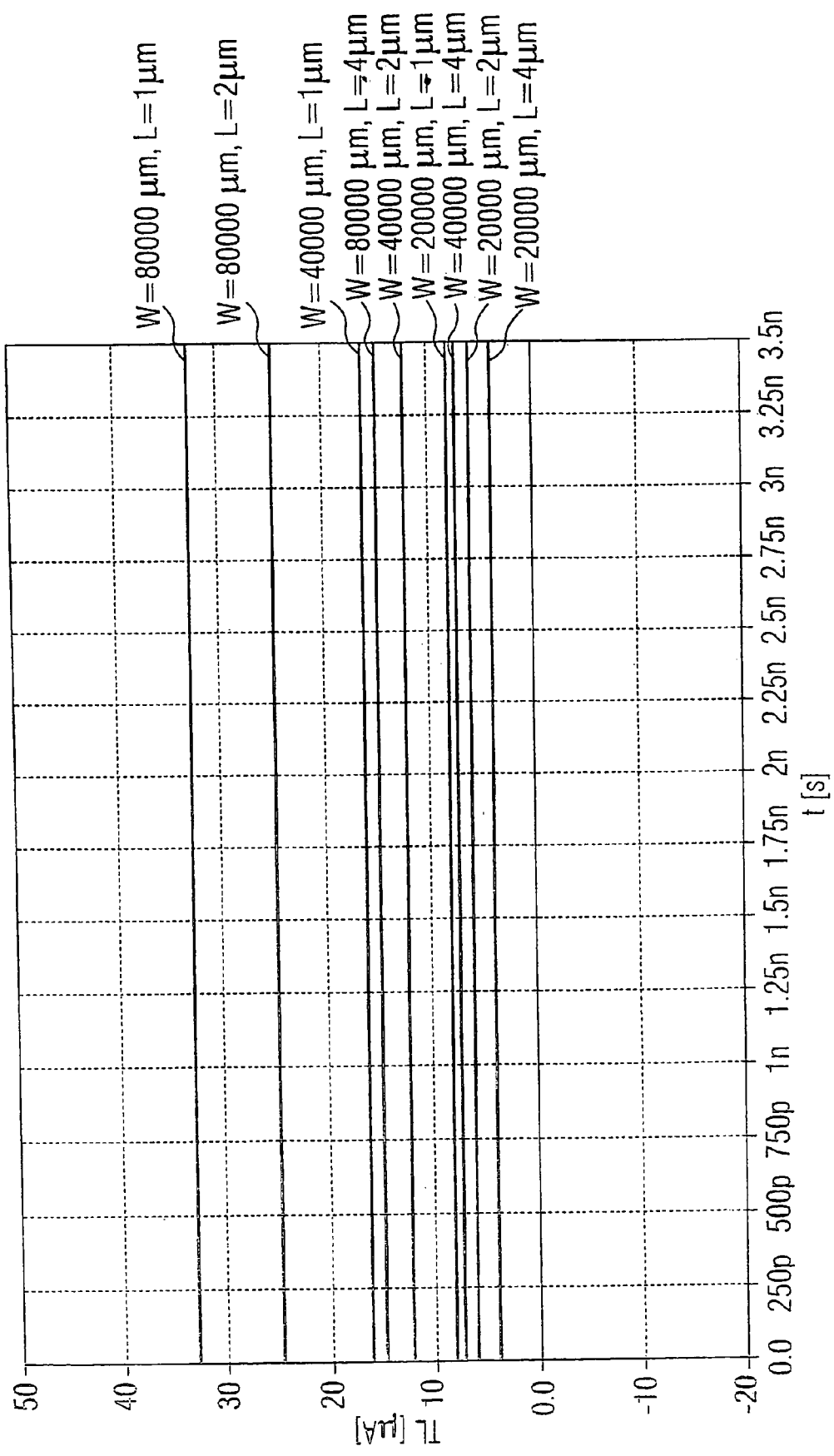

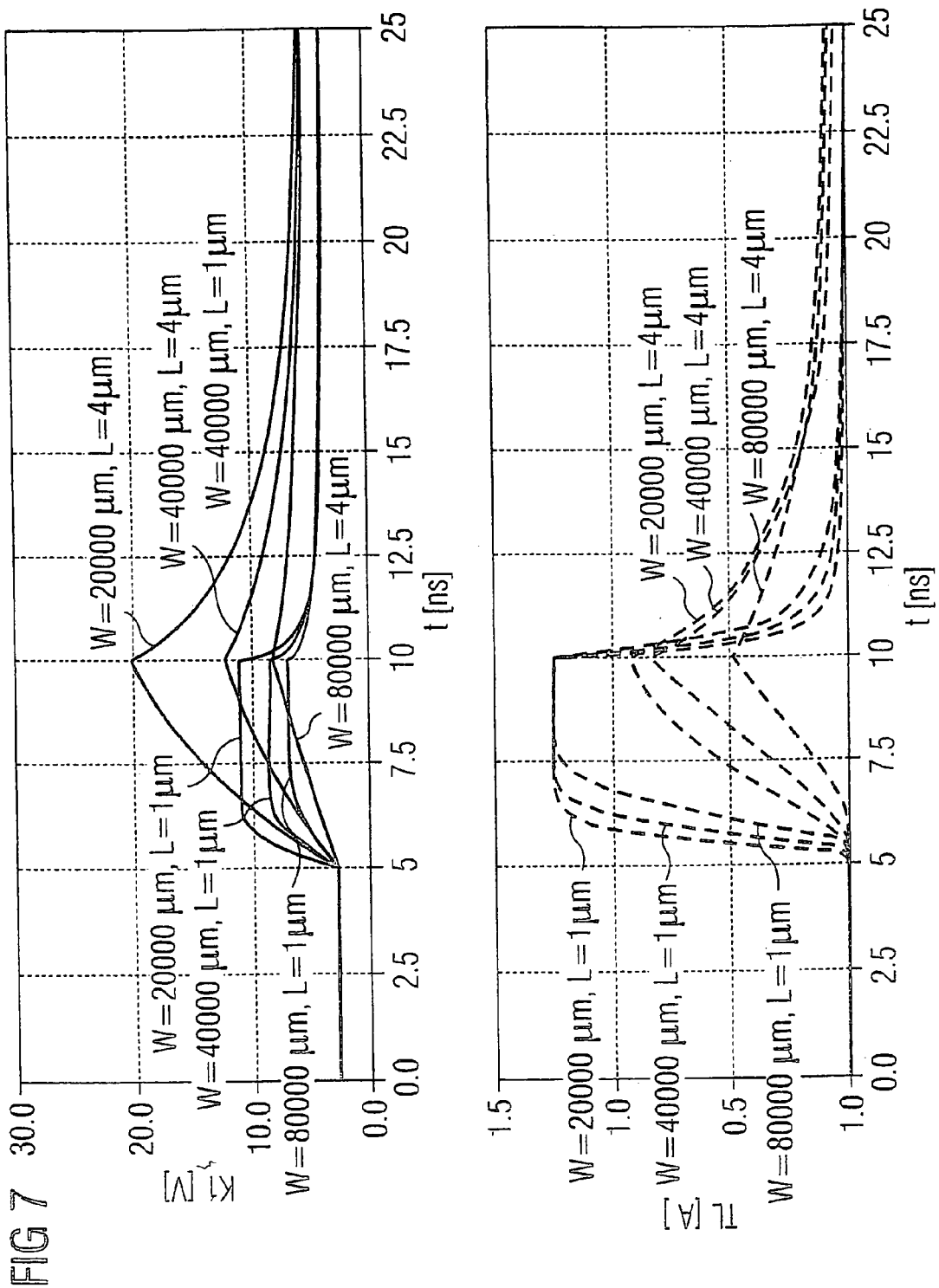

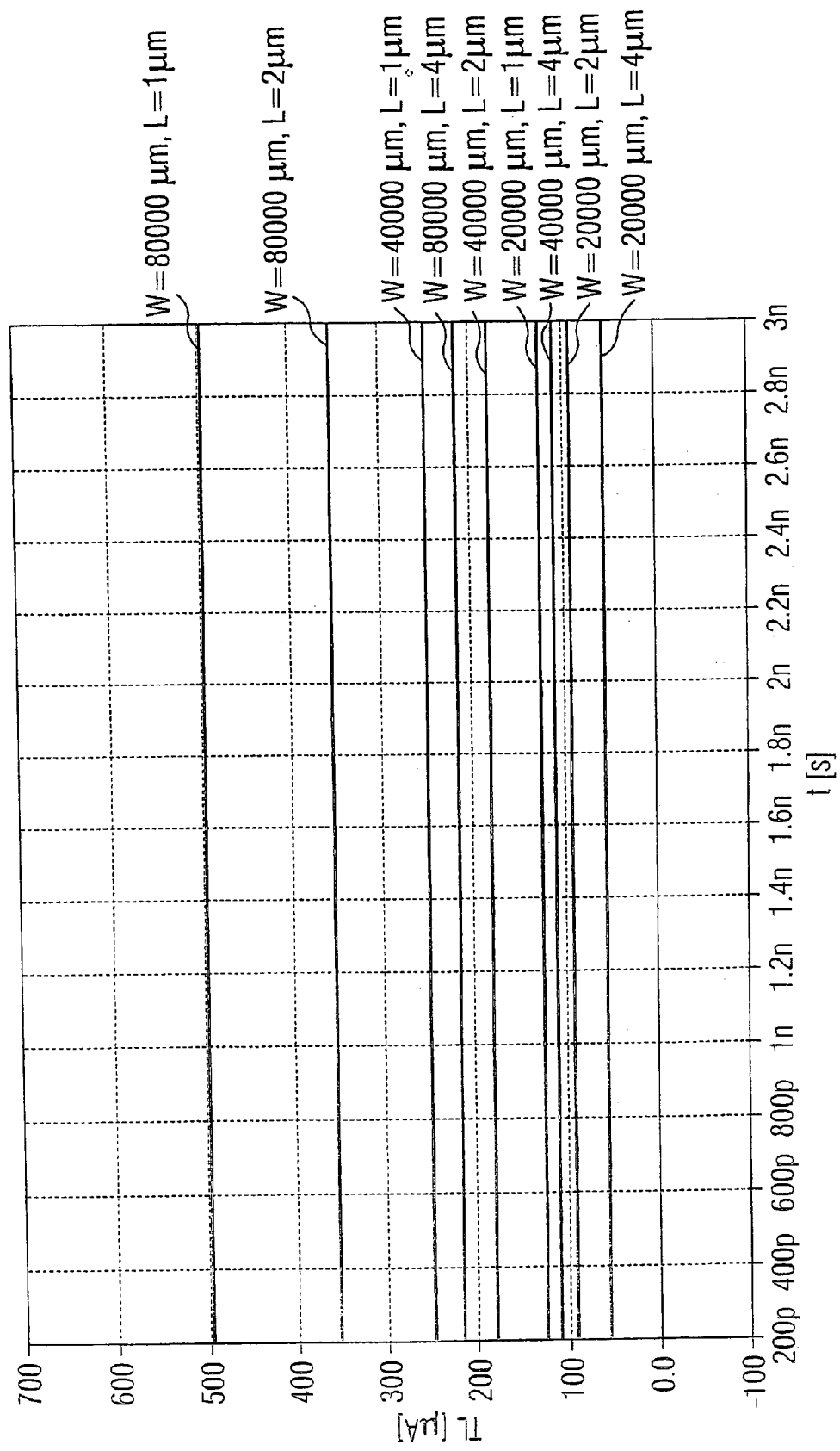

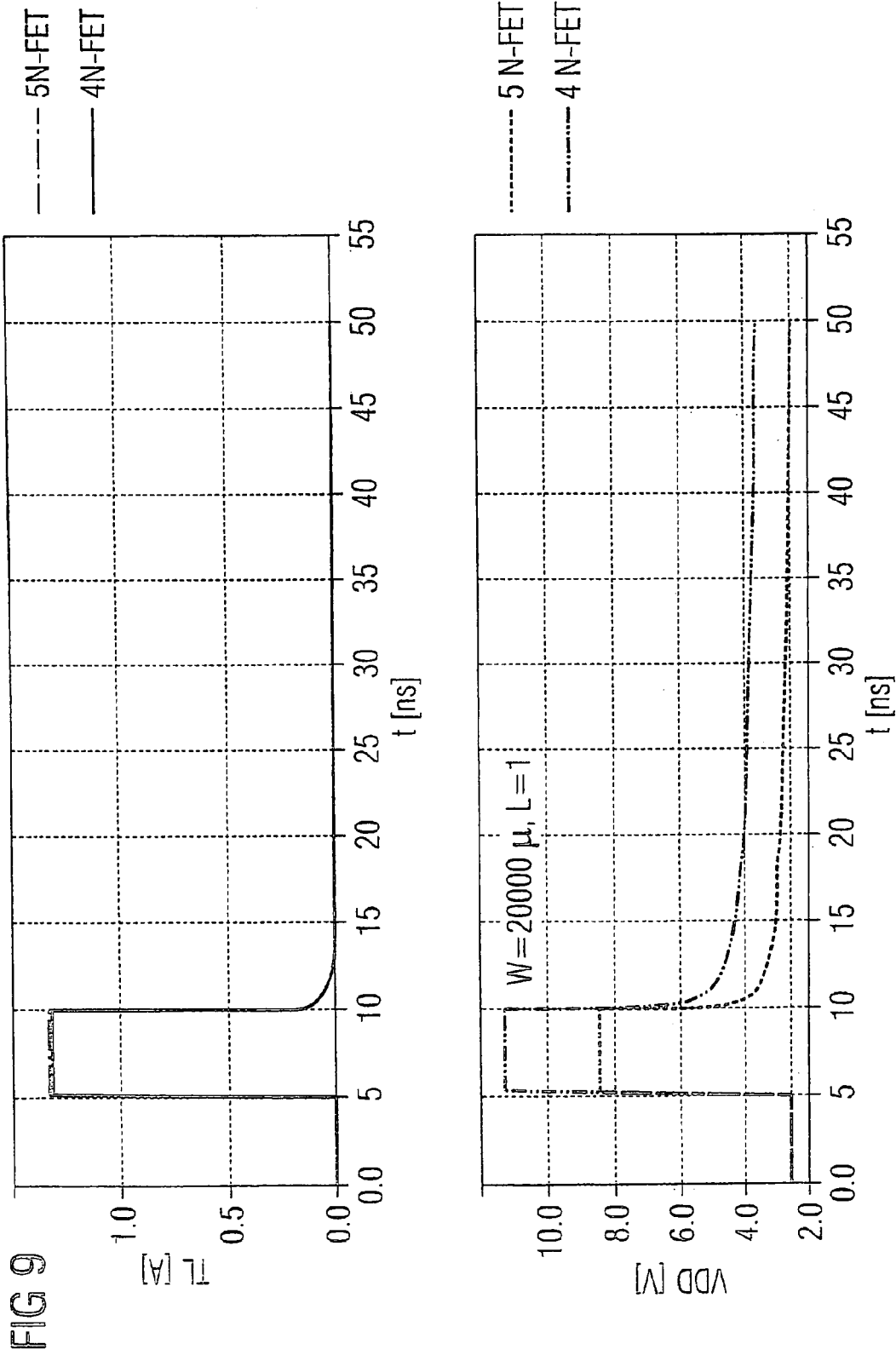

INTEGRATED CIRCUIT WITH ELECTROSTATIC DISCHARGE PROTECTION

CROSS REFERENCE TO RELATED APPLICATIONS

This application is a continuation of PCT/DE02004/002098, filed Sep. 20, 2004, and titled "Integrated Circuit With Electronic Discharge Protection," which claims priority to German Application No. DE 103 44 872.1, filed on Sep. 26, 2003, and titled "Integrated Circuit With Electronic Discharge Protection," the entire contents of which are hereby incorporated by reference.

FIELD OF THE INVENTION

The invention relates to an integrated circuit with electrostatic discharge protection.

BACKGROUND

The electrostatic charge that can be taken up by a person is of the order of magnitude of approximately 0.6 µC. The person can be simulated by a capacitor having the capacitance of 150 pF. If the charge of 0.6 µC is stored on a capacitor having the capacitance of 150 pF, then this corresponds to a charging voltage of approximately 4 kV. If a person who has been charged to such a voltage touches a grounded object, an electrostatic discharge occurs. The latter proceeds in approximately 0.1 µs with currents of up to several amperes.

Due to the small oxide thickness and the small dimensions of the interconnects and pn junctions, electrostatic discharge processes proceeding via MOS (Metal Oxide Semiconductor) components can lead to the destruction of the device. The discharge processes primarily lead to the breakdown of the gate oxide or else to the overheating of pn junctions or interconnects. The energy converted during an electrostatic discharge is of the order of magnitude of 0.1 mJ and is therefore not very high. However, if this energy is fed in pulsed fashion into a volume of the order of magnitude of a few cubic micrometers, then this can give rise locally to such a high temperature that the silicon melts. Output terminals are generally less sensitive than input terminals since the output driver transistors have a large energy absorption capacity. Input terminals are connected to the gate terminals of the input transistors. The thin layers of the gate oxide can easily be destroyed in the case of electrostatic discharge. Input terminals of an integrated circuit should therefore have ESD (electrostatic discharge) protection circuits. The ESD protection circuits must have high resistance for input voltages that lie within the specification. They should have low resistance for voltages that lie outside the specification and, in particular, in the ESD range.

In a known circuit arrangement for protecting integrated circuits against electrostatic discharge, protection diodes, so-called ESD diodes, are used. The cathode terminal of the diode is connected to an input terminal of the integrated circuit at which the occurrence of a high electrostatic voltage is to be expected. The anode terminal is connected to a terminal for the reference potential. If positive voltages that lie outside the specification occur at the reference potential terminal, then the diode is forward-biased and dissipates the positive electrostatic charge to the input terminal of the integrated circuit that is connected to its cathode.

If a high positive electrostatic voltage occurs at one of the input terminals of the integrated circuit, then the ESD diode is operated in the blocking range. At sufficiently high voltages, lying between 7 V and 12 V for example, a breakdown occurs at the diode on account of the avalanche effect. The diode has become conductive. The electrostatic charge present at the input terminal of the integrated circuit is dissipated via the diode path to the terminal for the reference potential of the integrated circuit.

In particular during the production of semiconductor memories, diodes are not fabricated in a production process provided especially for them. They arise as by-products during the production of transistors within integrated circuits. The drain-substrate diodes that form between drain and substrate shall be mentioned as an example in the case of transistors. The behavior of such diode structures is not controlled during the production process. The breakdown behavior of the diode structures is therefore known only to an approximation. What is problematic is that the voltages required for the diode breakdown are often so high that the components of the integrated circuit are already destroyed before the diode breaks down in the reverse direction. This applies primarily when using MOS circuits having thin gate oxides.

SUMMARY

The present invention provides an integrated circuit with electrostatic discharge protection, the circuit design of which enables a good adaptation to the respective ESD requirements.

In accordance with the present invention, an integrated circuit with electrostatic discharge protection comprises least one input terminal that applies a signal level, a terminal that applies a reference potential, and a functional unit containing logic gates and memory cells.

The integrated circuit furthermore comprises a first transistor including a source terminal, a drain terminal and a gate terminal, and also a second transistor including a source terminal, a drain terminal and a gate terminal. The gate terminal of the first transistor and of the second transistor is in each case connected to the drain terminal of the respective first and second transistor. The first transistor is connected in series with the second transistor by one of the drain and source terminals of the first transistor being connected to one of the drain and source terminals of the second transistor. The functional unit is connected between the at least one input terminal and the terminal that applies the reference potential. Furthermore, the series circuit comprising the first transistor and the second transistor is also connected between the at least one input terminal and the terminal that applies the reference potential.

The functional unit is formed in such a way that, in a normal operating mode, it carries out a digital signal processing if the signal level present at the at least one input terminal matches a first signal level. The series circuit comprising the first transistor and the second transistor is formed in such a way that the at least one input terminal is connected to the terminal that applies the reference potential with lower resistance via the series circuit comprising the first transistor and the second transistor and via the functional unit when, in a discharge case, the signal level present at the at least one input terminal is greater than a threshold value above the first signal level. Furthermore, the series circuit comprising the first transistor and the second transistor is connected to the terminal that applies the reference potential with higher resistance than via the functional unit when, in the normal operating mode, the signal level present at the at least one input terminal is less than or equal to the first signal level.

The advantage when using transistors for an ESD protection circuit is that the processes for producing transistors and thus also the transistors of the ESD series circuit during the process for fabricating integrated circuits can be controlled relatively easily. It is thereby possible to realize protection circuit structures for which a specific threshold value can be specified, the exceeding of which results in the short-circuiting of a voltage at the input terminals or an electrostatic charge between the input terminals and the terminal for application of the reference potential.

In accordance with an embodiment of the integrated circuit, in the case of a plurality of input terminals, at least one of the input terminals is formed as a terminal that applies a supply potential.

In a further embodiment of the invention, at least one of the input terminals is formed as a bidirectional terminal that reads data in and out. If the input terminal is connected up in this way and the cascade of the transistors is connected between the input terminal and the terminal that applies second supply potential, then an electrostatic charge which occurs at the input terminal is dissipated to the terminal that applies the second supply potential.

In an embodiment of the invention, the functional unit comprises a random access memory including memory cells connected in each case to a word line and a bit line. A memory cell of the functional unit can be selected by addresses. If the input terminal is formed as a terminal that applies addresses and the cascade of the transistors is connected between the input terminal connected up in this way and the terminal that applies the reference potential, then an electrostatic charge which occurs at the input terminal is dissipated to the terminal for the reference potential.

In another embodiment of the invention, the first transistor and the second transistor are dimensioned such that they are switched into the conductive state in the discharge case and are nonconductive in the normal operating mode of the functional unit. The requisite dimensioning is effected by way of the number of transistors of the series circuit and also the change in the length and width ratios of the individual transistors.

In a further embodiment of the invention, the transistors are formed as n-channel field effect transistors.

In yet another embodiment of the invention, the transistors are formed as p-channel field effect transistors.

The at least one input terminal that applies the supply potential can be formed to apply a positive supply potential.

A method for producing an integrated circuit with electrostatic discharge protection is provided as follows. The first transistor and the second transistor of the series circuit are dimensioned with regard to their channel length and channel width such that a voltage of less than 11 V is present when dissipating an electrostatic charge of at least 0.3 µC at the integrated circuit. A charge of 0.3 µC arises for example at a capacitor having the capacitance of 150 pF if a voltage of 2000 V is applied to it. A capacitor of 150 pF is charged to 2000 V in a known test method, the so-called human body model, for checking the ESD strength of devices. This electrostatic voltage is used to subsequently carry out controlled discharge processes at electronic devices.

In a further embodiment of the invention, the first transistor and the second transistor of the series circuit are dimensioned with regard to their channel length and channel width such that a current of less than 1.3 A flows when dissipating an electrostatic charge of at least 0.3 µC via the series circuit of the transistors.

In another embodiment of the invention, the first transistor and the second transistor of the series circuit are dimensioned with regard to their channel length and channel width such that the lost current flowing through the series circuit of the transistors in the normal operating mode is less than a current of 500 µA.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 1 shows an integrated circuit of a semiconductor memory with an ESD protection circuit.

FIG. 2 shows a subcircuit of the integrated circuit of a semiconductor memory with an ESD protection circuit.

FIG. 3A shows a cross section through a transistor of the ESD protection circuit.

FIG. 3B shows a plan view of a transistor of the ESD protection circuit.

FIG. 4 shows a circuit arrangement for testing an electronic device for ESD compatibility according to the human body model.

FIG. 6 shows the simulation of a lost current of a series circuit comprising five transistors for ESD protection according to the invention with a change in the channel lengths and channel widths of the transistors.

FIG. 7 shows a simulation of a current/voltage diagram of a series circuit comprising four transistors for ESD protection according to the invention with a change in the channel lengths and channel widths of the transistors.

FIG. 8 shows the simulation of a lost current of a series circuit comprising four transistors for ESD protection according to the invention with a change in the channel lengths and channel widths of the transistors.

FIG. 9 shows a simulation of a current/voltage diagram of a series circuit comprising four and five transistors for ESD protection according to the invention.

DETAILED DESCRIPTION

Figure 5:
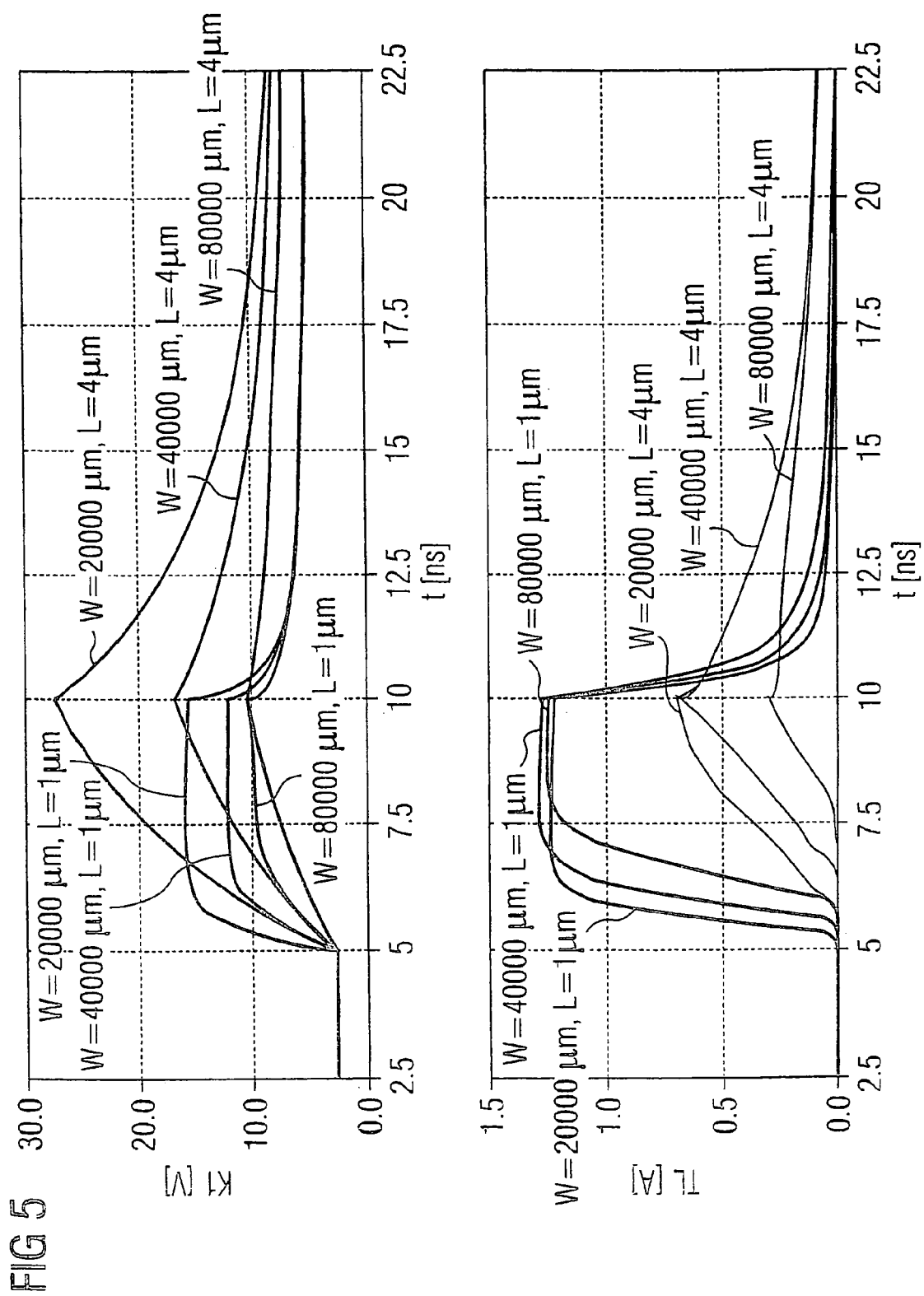
FIG. 5 shows a simulation of a current/voltage diagram of a series circuit comprising five transistors for ESD protection according to the invention with a change in the channel lengths and channel widths of the transistors.

FIG. 1 shows a semiconductor memory HS containing integrated circuit components ES1, ES2, . . . , ESn for electrostatic discharge protection and a memory cell array SZ.

The memory cell array SZ is connected to an input terminal 1 of the semiconductor memory HS for application of a supply potential $V_{DD}$, a terminal 2 of the semiconductor memory HS for application of a reference potential $V_{SS}$ and to further input terminals 3, 4, . . . , n of the semiconductor memory HS. In FIG. 1, the input terminal 3 of the semiconductor memory HS is formed as a bidirectional terminal for reading data in and out, and the input terminals 4, . . . , n of the semiconductor memory HS are formed as terminals for application of addresses. The memory cell array contains DRAM memory cells, each of which is connected to a word line WL and a bit line BL. For reasons of improved clarity, only one DRAM memory cell is illustrated in the memory cell array illustrated in FIG. 1. Said memory cell comprises a selection transistor AT and a storage capacitor SC. The selection transistor AT is connected between the bit line BL and the storage capacitor SC. If the selection transistor is switched into the conductive state by a control signal on the word line, then it acts like a closed switch and connects the storage capacitor SC to the bit line BL. The storage capacitor can then be accessed in reading or writing fashion. If the logic state 1, for example, is stored in the memory cell, then the capacitor is discharged during the read-out of the memory cell, so that a discharge current flows on the bit line. In the opposite case, when writing the logic state 1 to the memory cell, the capacitor is charged by a charging current flowing on the bit line. In order to operate the memory cell array normally as intended, for example in order to be able to effect reading and writing access, the transistors T1, T2, ..., Tn of the series circuit comprising n transistors must be in the nonconductive state and the supply voltage $V_{DD}$ must be present at the terminal 1 of the semiconductor memory HS and the reference potential $V_{SS}$ must be present at the terminal 2 of the semiconductor memory HS.

The integrated circuit component ES1 for electrostatic discharge protection is connected via its input terminal E1 to the input terminal 1 of the semiconductor memory HS for application of the supply potential $V_{DD}$, and via its output terminal A1 to the terminal 2 of the semiconductor memory HS for application of the reference potential $V_{SS}$. The integrated circuit component ES2 for electrostatic discharge protection is connected via its input terminal E2 to the bidirectional input terminal 3 of the semiconductor memory HS for reading data in and out, and via its output terminal A2 to the terminal 2 of the semiconductor memory HS for application of the reference potential $V_{SS}$. The integrated circuit component ES3 for electrostatic discharge protection is connected via its input terminal E3 to the input terminal 4 of the semiconductor memory HS for application of addresses, and via its output terminal A3 to the terminal 2 of the semiconductor memory HS for application of the reference potential $V_{SS}$. The integrated circuit component ESn for electrostatic discharge protection is connected via its input terminal En to the input terminal n of the semiconductor memory HS for application of addresses, and via its output terminal An to the terminal 2 of the semiconductor memory HS for application of the reference potential $V_{SS}$.

The circuit components ES1, ES2, ..., ESn for electrostatic discharge protection in each case contain a series circuit comprising n transistors T1, T2, ..., Tn. Since the interconnection of the n transistors and the functioning of the n circuit components is identical, only the circuit component ES1 will be explained here. The n transistors of the circuit component ES1 are formed as n-channel field effect transistors in FIG. 1. In this case, the drain terminal D1 of the transistor T1 is connected to the input terminal E1 of the circuit component ES1. The source terminal S1 of the transistor T1 is connected to the drain terminal D2 of the transistor T2. The series circuit continues in this way up to the transistor Tn. The transistor Tn is connected by its source terminal to the output terminal A1 of the circuit component ES1. The gate terminals G1, G2, ..., Gn of the transistors T1, T2, ..., Tn are in each case connected to the drain terminals D1, D2, ..., Dn.

The functioning of the circuit component ES1 for electrostatic discharge protection is explained below. In a normal operating mode of the integrated circuit, signal levels that lie within specific limits are present at the input terminal 1 for application of the supply potential $V_{DD}$ and at the input terminals 3, 4, ..., n for reading data in and out. In general, the normal operating mode, for example a digital signal processing by the functional unit SZ, is ensured only at signal levels which lie in this range. In the normal operating mode, the series circuit comprising the transistors T1, T2, ..., Tn is at high resistance, so that the signal level at the input terminals 1, 3, 4, ..., n are fed to the functional unit SZ on the input side.

If a high electrostatic voltage lying outside the voltages specified for normal operation of the memory cell array SZ occurs between the terminals 1 and 2 of the semiconductor memory HS, then an electrostatic discharge occurs. The series circuit of the n transistors is dimensioned such that the transistors T1, T2, ..., Tn are switched into the conductive state in the event of said discharge. In this case, the transistors can be dimensioned by setting the channel length and width ratios of the transistors. Via the transistor line TL, a low-resistance connection is produced between the input terminal 1 and the terminal 2 of the semiconductor memory HS. The series circuit between the input terminals and the terminal for application of the reference potential acts with lower resistance for the signals present at the input terminals than the functional unit SZ that is likewise connected between the same input terminals and the terminal for application of the reference potential. The high electrostatic charge present at an affected input terminal is thus dissipated via the lower-resistance series circuit formed by the transistors T1, T2, ..., Tn, to the terminal for application of the reference potential, which is formed for example as a terminal for application of a ground potential.

In contrast to the use of ESD protection diodes, which, in the case of electrostatic discharge, will generally acquire extremely low resistance in the reverse direction on account of the avalanche breakdown, the transistors of the ESD series circuit RS are operated in the forward direction in the case of electrostatic discharge. The switching threshold at which the transistor line TL, which is essentially formed from the drain-source parts of the transistors T1, T2, ..., Tn, requires low resistance can be set by the number of transistors connected in series.

The functioning of the rest of the circuit components ES2, ..., ESn is identical to that described above. Since the input terminals E2, E3, ..., En of the circuit components ES2, ES3, ..., ESn are connected to in each case different input terminals 3, 4, ..., n of the semiconductor memory HS, the electrostatic discharge then takes place between the respective input terminals of the semiconductor memory HS and the terminal 2 of the semiconductor memory HS for application of the reference potential.

FIG. 2 shows a semiconductor memory HS having an ESD protection circuit ES1 and an input terminal 1 for application of the supply potential $V_{DD}$ and a terminal 2 for application of the reference potential $V_{SS}$. Since only the circuit component ES1 is to be described here, all the rest of the components of the semiconductor memory HS as are illustrated in FIG. 1 are not illustrated here. The circuit component ES1 is connected via its input terminal E1 to the input terminal 1 of the semiconductor memory HS for application of the supply potential $V_{DD}$ and via its output terminal A1 to the terminal 2 of the semiconductor memory HS for application of the reference potential $V_{SS}$. In contrast to the circuit component ES1 illustrated in FIG. 1, p-channel transistors are used in the circuit component ES1 illustrated in FIG. 2. In this case, the source and drain terminals are interchanged in comparison with the n-channel transistors used in FIG. 1. The source terminal S1 of the transistor T1 is connected to the input terminal E1 of the circuit component ES1. The drain terminal D1 of the transistor T1 is connected to the source terminal S2 of the transistor T2. The series circuit continues in this way up to the transistor Tn. The transistor Tn is connected by its drain terminal to the output terminal A1 of the circuit component ES1. The gate terminals G1, G2, . . . , Gn of the transistors T1, T2, . . . , Tn are in each case connected to their drain terminals D1, D2, . . . , Dn.

FIG. 3A shows the cross section through a transistor T1 described in FIG. 1, which transistor is formed as an n-channel field effect transistor. A first n-doped region NG1 and a second n-doped region NG2 are arranged in a p-doped substrate PS. The first region NG1 is connected to a source terminal S. The second region NG2 is connected to a drain terminal D. A contact MK is connected to the gate terminal G and insulated from the p-doped substrate PS by a gate oxide layer O. Upon application of a positive gate-source voltage $U_{GS}$ between the terminal G and the terminal S, an n-conducting channel K forms below the insulating oxide layer. The length of the channel is designated by LK.

FIG. 3B shows the plan view of the transistor T1 described in FIG. 3A. For reasons of improved clarity, the gate terminal G, the metallized contact MK, the oxide layer O and the p-doped substrate PS are not depicted. The conductive channel K has the width WK and is delimited by the first n-doped region NG1 toward one side and by the second n-doped region NG2 toward the other side.

The series circuit formed by the n transistors can be dimensioned by setting the length of the channel and the width of the channel of the transistors. In this case, the channel width essentially determines the maximum current that flows in the discharge case. The length of the transistors essentially determines the switching speed. More precise investigations in this respect can be gathered from the diagrams in FIGS. 5, 6, 7 and 8.

FIG. 4 shows a circuit arrangement for checking the ESD strength of an electronic device DUT (=device under test), for example of the semiconductor memory circuit HS from FIG. 1, according to the so-called human body model. The circuit arrangement comprises a subcircuit L containing a voltage generator $G_L$ and a resistor $R_L$, and a subcircuit H containing a capacitor $C_H$ and a resistor $R_H$. The generator $G_L$ is connected to a switch $S_L$ via the resistor $R_L$. The resistor can be connected to the first terminal K1 of a capacitor $C_H$ via the switch $S_L$. The capacitor $C_H$ is connected to a reference potential $V_{SS}$ via a second terminal M. In the human body model, the capacitor $C_H$ simulates a person carrying an electrostatic charge and has a value of 150 pF. The terminal K1 of the capacitor $C_H$ is connected to a switch $S_H$ via a resistor $R_H$. In the human body model, the resistor $R_H$ represents a discharge resistance, for example the skin resistance, and has a value of 1.5 kΩ. The electronic device DUT that is to be checked with regard to ESD strength is connected to the switch $S_H$ via a terminal H1 and to the terminal M of the reference potential via a terminal H2.

The above-described circuit arrangement according to the human body model is used to test whether an integrated circuit withstands a discharge of at least 2 kV undamaged with regard to the input and supply terminals. The devices are tested in two cycles. During the first cycle, the switch $S_L$ is closed and the switch $S_H$ is open. The generator $G_L$ subsequently charges the capacitor $C_H$ to a voltage of 2 kV via the resistor $R_L$. In the second test cycle, the switch $S_L$ is opened again and the switch $S_H$ is closed. The terminals H1 and H2 are then connected via the resistor $R_H$ to the capacitor that has been charged to 2 kV. The capacitor is discharged after approximately 1 μs. During a functional test that is subsequently to be carried out, it is investigated whether the device has withstood the discharge process undamaged.

The behavior of the circuit ES1 connected between the input terminal 1 of the semiconductor memory HS for application of the supply potential $V_{DD}$ and the terminal 2 of the semiconductor memory HS for application of the reference potential $V_{SS}$ will be illustrated below with reference to the diagrams illustrated in FIGS. 5, 6, 7, 8 and 9. The behavior of the circuit component ES2 connected between the input terminal 3 for reading data in and out of the circuit component ES3, . . . , ESn connected between the input terminal 4, . . . , n for application of addresses and the terminal 2 for application of the reference potential is identical to the behavior of the circuit component ES1.

FIG. 5 shows the simulation of a current and voltage diagram of a circuit component ES1 of the semiconductor memory HS from FIG. 1. The simulation time period extends between 2.5 ns and 22.5 ns. The circuit component ES1 contains a series circuit comprising five transistors and is connected between the input terminal 1 of the semiconductor memory HS for application of the supply potential $V_{DD}$ and the terminal 2 of the semiconductor memory HS for application of the reference potential $V_{SS}$. At the instant 2.5 ns, a supply voltage of 2.5 V is present between the input terminal 1 and the terminal 2, said supply voltage being required for normal operation of the functional unit, for example a DRAM memory cell array. Between the instant 5 ns and 10 ns, a voltage surge of 2000 V occurs at the input terminal 1. Said voltage surge may be brought about for example by a person carrying an electrostatic voltage of 2000 V. In the human body model for testing devices with regard to ESD strength, this corresponds to the connection of the terminal H1 of the circuit arrangement to the input terminal 1 of the semiconductor memory and the connection of the terminal H2 of the circuit arrangement to the terminal 2 of the semiconductor memory. The capacitance $C_H$ is charged to 2000 V and is connected to the input terminal 1 of the semiconductor memory at the instant 5 ns via the closing of the switch $S_H$. The discharge process that subsequently proceeds via the circuit ES1 is interrupted again by the opening of the switch $S_H$ at the instant 10 ns.

The first (i.e., top) diagram of FIG. 5 contains six curves illustrating the profile of the voltage at the node K1 from FIG. 4 for different lengths and widths of the channel of the transistors. The second (i.e., bottom) diagram of FIG. 5 likewise contains six curves showing the profile of the current in the transistor line TL for different lengths and widths of the channel of the transistors. Part of the current flowing in the case of electrostatic discharge flows away via the substrate and is not illustrated in the first diagram. The channel length of the transistors varies between 1 μm and 4 μm. The channel width is in each case changed here between 20 000 μm, 40 000 μm and 80 000 μm.

As can be seen from the first diagram, the transistors having the length L=4 μm exhibit a slowly rising voltage profile upon the closing of the switch $S_H$ at the instant 5 ns and have still not reached the saturation state at the instant 10 ns. The rate of rise of the voltage decreases as the channel width of the transistors increases. The voltage dropped across the series circuit formed by the five transistors likewise decreases as the channel width of the transistors increases. At the instant 10 ns, it reaches a value of approximately 25 V for a width of 20 000 μm, and approximately 18 V are reached for a width of 40 000 μm and approximately 11 V are reached for a width of 80 000 μm. After the voltage surge has proceeded, the voltage at the node K1 from FIG. 1 slowly falls back again.

The transistors having the length L=1 μm exhibit a rapidly rising voltage profile upon the closing of the switch $S_H$ at the instant 5 ns. The saturation state has already been reached at the instant 8 ns. The voltage dropped across the series circuit formed by the five transistors again decreases as the width of the channel of the transistors increases. At the instant 10 ns, it reaches a value of approximately 16 V for a width of 20 000 μm, and approximately 12 V are reached for a width of 40 000 μm and approximately 10 V are reached for a width of 80 000 μm. On account of the faster switching speed of the transistors having the length L=1 μm, after the end of the voltage pulse at the instant 10 ns the voltage falls back more rapidly than in the case of the transistors having the length L=4 μm.

The transistors having the length L=4 μm exhibit a slowly rising current profile upon the closing of the switch $S_H$ at the instant 5 ns and have still not reached the saturation current at the end of the voltage surge at the instant 10 ns. The rate of rise of the current decreases as the channel width of the transistors increases. At the instant 10 ns, the current of the series circuit comprising the five transistors reaches a value of approximately 0.75 A for a width of 20 000 μm, a value of approximately 0.65 A for a width of 40 000 μm and a value of 0.3 A for a width of 80 000 μm. After the voltage surge has proceeded, the current in the transistor line TL slowly falls back again.

For transistors having the length L=1 μm, it is possible to discern a rapid rise in the current when the case of electrostatic discharge occurs at the instant 5 ns. The rate of rise of the current decreases as the channel width increases. This also corresponds to the voltage profile from diagram 1. The saturation current of approximately 1.3 A is reached after approximately 8 ns. As has already become evident on the basis of the voltage diagram, the current in the case of transistors having the length L=1 μm, at the end of the voltage surge, also falls back more rapidly on account of the faster switching speed than in the case of the transistors having the length L=4 μm.

FIG. 6 shows the simulation of the lost current of a circuit component ES1 of the semiconductor memory from FIG. 1. The circuit component ES1 contains a series circuit comprising five transistors. The simulation time period extends from 0 to 3.5 ns. During this time, a supply voltage of 2.5 V is applied between the input terminal 1 of the semiconductor memory and the terminal 2 of the semiconductor memory. The voltage is required for normal operation of a functional unit, for example a DRAM memory.

The current diagram contains nine curves illustrating the magnitude of the lost current in the transistor branch TL for different channel lengths and channel widths of the transistors. The length of the channel of the transistors varies between 1 μm, 2 μm and 4 μm. The channel width is changed here in each case between 20 000 μm, 40 000 μm and 80 000 μm.

As can be discerned from the diagram, the lost current decreases as the length of the channel increases and as the width of the channel of the transistors decreases. The lost current is greatest with a value of approximately 32 μA when the channel has a width of 80 000 μm and a length of 1 μm. If the length of the channel is extended to 2 μm, the lost current decreases to approximately 25 μA. When the channel has a width of 40 000 μm and a length of 1 μm, the lost current results as approximately 17 μA. For further pairs of lengths and widths of the channel of the transistors, the lost current can be gathered from the diagram. The lowest lost current illustrated in the diagram arises for a channel length of 4 μm and a channel width of 20 000 μm. The lost current is only approximately 5 μA for these values. By comparison with the current/voltage diagram illustrated in FIG. 5, it can be seen that the switching speed for transistors having the length L=4 μm is slow in comparison with the use of transistors having shorter channel lengths of L=1 μm. The maximum discharge current dissipated in the transistor branch TL is smaller for a channel length of 4 μm than for a channel length of 1 μm. Suitable channel length and width ratios which meet the respective requirements made of the circuit for ESD protection can be gathered from the diagram of FIGS. 5 and 6.

FIG. 7 shows the simulation of a current/voltage diagram of a circuit component ES1 of the semiconductor memory HS from FIG. 1. The simulation time period extends from 0 to 25 ns. The circuit component ES1 contains a series circuit comprising four transistors and is connected between the input terminal 1 of the semiconductor memory for application of the supply potential $V_{DD}$ and the terminal 2 of the semiconductor memory for application of the reference potential $V_{SS}$. At the beginning of the simulation time period up to the instant 5 ns a supply voltage of 2.5 V is present between the input terminal 1 of the semiconductor memory and the terminal 2 of the semiconductor memory, said supply voltage being required for normal operation of the functional unit, for example a DRAM memory cell array. A voltage surge of 2000 V occurs at the input terminal 1 of the semiconductor memory between the instants 5 ns and 10 ns. Said voltage surge is generated by a circuit arrangement of the human body model for testing devices with regard to ESD strength, as has already been described in FIG. 5. For elucidation of the circuit arrangement, reference is made to the explanations regarding FIG. 5.

The first (i.e., top) diagram of FIG. 7 contains six curves illustrating the profile of the voltage at the node K1 for different channel lengths and channel widths of the transistors. The second (i.e., bottom) diagram of FIG. 7 contains six curves illustrating the profile of the current in the transistor line TL for different channel lengths and channel widths of the transistors. Part of the current flowing in the case of electrostatic discharge flows away via the substrate and is not illustrated in the diagram. The length of the channel varies between 1 μm and 4 μm, and the width is changed here in each case between 20 000 μm, 40 000 μm and 80 000 μm. As can be seen from the first diagram, the transistors having the channel length L=4 μm exhibit a slowly rising voltage profile when the voltage surge occurs at the instant 5 ns and have still not reached the saturation voltage at the end of the voltage surge at the instant 10 ns. The rate of rise of the voltage decreases as the channel width increases. It can furthermore be discerned that the voltage dropped across the series circuit formed by the four transistors likewise decreases as the channel width of the transistors increases. At the instant 10 ns, it reaches a value of approximately 20 V for a channel width of 20 000 μm, and approximately 12 V are reached for a channel width of 40 000 μm and approximately 8 V are reached for a channel width of 80 000 μm. After the voltage surge has proceeded, the voltage at the node K1 slowly falls back again.

The transistors having the channel length L=1 μm exhibit a rapidly rising voltage profile when the voltage pulse occurs at the instant 5 ns. The saturation state has already been reached at the instant 8 ns. In this case, too, the rate of rise of the voltage decreases as the channel width increases. The voltage dropped across the series circuit formed by the four transistors likewise decreases as the channel width of the transistors increases. At the instant 8 ns, the voltage reaches a value of approximately 11 V for a width of the channel of the transistors of 20 000 μm, and approximately 8.5 V are reached for a channel width of 40 000 μm and approximately 7.5 V are reached for a channel width of 80 000 μm. On account of the faster switching speed of the transistors having the channel length L=1 μm, after the end of the voltage pulse at the instant 10 ns the voltage falls back more rapidly than in the case of the transistors having the channel length L=4 μm.

The behavior of the current/voltage profile as a function of different channel widths and channel lengths of the transistors when the case of electrostatic discharge occurs thus corresponds to the current/voltage profiles described in FIG. 5. The differences in using a circuit comprising a series circuit comprising four transistors and a series circuit comprising five transistors will also be discussed below. It becomes clear when comparing the voltage diagrams from FIG. 5 and FIG. 7 that the voltage drop across the series circuit comprising four transistors is smaller than when using five transistors, assuming that the transistors have identical channel length and channel width ratios. It becomes clear when comparing the current diagrams from FIG. 5 and FIG. 7 that when the saturation current is reached in the discharge case, the maximum current in the transistor branch TL becomes independent of the number of transistors used in the series circuit. This becomes clear for example in the case of the transistors having the channel length L=1 μm, since the saturation current is reached here. In the case of the transistors which do not attain saturation, such as, for example, in the case of the transistors having the channel length L=4 μm, the current flowing in the transistor branch TL in the case of electrostatic discharge increases as the number of transistors decreases.

FIG. 8 shows the simulation of the lost current of a circuit component ES1 of the semiconductor memory HS from FIG. 1. In contrast to the circuit component ES1 for protection against electrostatic discharge as described in FIG. 6, the series circuit of the circuit component ES1 simulated in FIG. 8 contains only four transistors, however. The statements made in FIG. 6 regarding the behavior of the lost current as a function of the length and width ratios of the channel of the transistors apply correspondingly here. It becomes clear when comparing the diagram from FIG. 6 with the diagram from FIG. 8 that, with the use of identical length and width ratios of the channel of the transistors, the lost current increases as the number of transistors in the series circuit decreases.

FIG. 9 shows the simulation of a current/voltage diagram of a circuit for ESD protection according to the invention which contains a series circuit comprising five n-FET transistors and four n-FET transistors. In this case, the transistors of the series circuit comprising five transistors have a larger channel width than the transistors of the series circuit comprising four transistors. The simulation time period illustrated extends from 0 to 55 ns. At the beginning of the simulation up to the instant 5 ns, a supply voltage of 2.5 V is present at the input terminal 1 of the semiconductor memory from FIG. 1, said supply voltage being necessary for normal operation of the functional unit. The series circuit comprising five transistors has a lost current of approximately 7.5 μA in this time period. The series circuit comprising four transistors exhibits a lost current of approximately 126 μA. From the instant 5 ns up to the instant 10 ns, a voltage surge of 2000 V occurs at the input terminal 1 of the semiconductor memory. The transistors of the circuit component ES1 are switched into the conductive state when the voltage pulse occurs. A saturation current of approximately 1.3 A flows in the transistor branch TL. Said saturation current is independent of the number of transistors used in the series circuit. After the end of the voltage pulse, the current in the transistor branch falls back again down to a lost current. The voltage diagram of the two protection circuits, upon the occurrence of the voltage surge at the instant 5 ns, likewise shows a rise in the voltage which is dropped across the series circuit formed by the transistors of the ESD protection circuit.

In the case of the series circuit comprising five transistors, a voltage of approximately 8.5 V is dropped in the event of an electrostatic discharge. A voltage of approximately 11.5 V is dropped in the case of a series circuit comprising four transistors. The use of five transistors is more favorable through the optimization of the channel length and channel width ratios of the transistors with regard to the voltage swing that occurs at the series circuit formed by the transistors in the case of electrostatic discharge, and with regard to the lost current that occurs upon application of a supply voltage required for normal operation of the functional unit from FIG. 1.

LIST OF REFERENCE SYMBOLS

1 Terminal for application of the first supply potential
2 Terminal for application of the second supply potential
3, 4, . . . , n Input terminal
HS Semiconductor memory
ES Circuit component for ESD protection
Sz Memory cell array
$V_{DD}$ First supply potential
$V_{SS}$ Second supply potential
E Input terminal
A Output terminal
T Transistor
D Drain terminal
G Gate terminal
S Source terminal
AT Selection transistor
SC Storage transistor
WL Word line
BL Bit line
H1 First output terminal of the human body model
H2 Second output terminal of the human body model
NG n-doped region
PS p-doped substrate
MK Contact terminal
O Oxide layer
L First subcircuit of the human body model
H Second subcircuit of the human body model
$G_L$ Generator
$R_L$ Resistor
$S_L$ Switch
$C_H$ Capacitance
$R_H$ Resistor
$S_H$ Switch
DUT Device to be tested for ESD strength
$U_{GS}$ Gate-source voltage
LK Length of the conductive channel
WK Width of the conductive channel

What is claimed is:
1. An integrated circuit with electrostatic discharge protection, the integrated circuit comprising:
at least one input terminal that applies a signal level;
a terminal that applies a reference potential;
a functional unit containing logic gates and memory cells;

a first transistor comprising a source terminal, a drain terminal and a gate terminal connected to the drain terminal of the first transistor; and a second transistor comprising a source terminal, a drain terminal and a gate terminal connected to the drain terminal of the second transistor;

wherein:

a series circuit is arranged by connecting the first transistor in series with the second transistor by one of the drain and source terminals of the first transistor being connected to one of the drain and source terminals of the second transistor;

the functional unit and the series circuit are connected in parallel between the at least one input terminal and the terminal that applies the reference potential;

the functional unit is configured such that, in a normal operating mode, the functional unit carries out a digital signal process when the potential present at the at least one input terminal matches a first signal level;

the series circuit is configured such that the at least one input terminal is connected to the terminal that applies the reference potential with lower resistance via the series circuit and via the functional unit when, during a discharge, the signal level present at the at least one input terminal is greater than a threshold value above the first signal level; and the series circuit is configured such that the at least one input terminal is connected to the terminal that applies the reference potential with higher resistance via the series circuit and via the functional unit when, in the normal operating mode, the signal level present at the at least one input terminal is less than or equal to the first signal level.

2. The integrated circuit of claim 1, wherein the at least one input terminals is configured to apply a supply potential.

3. The integrated circuit of claim 1, wherein one of the input terminals if configured to read data in and out of the integrated circuit.

4. The integrated circuit of claim 1, wherein the functional unit comprises a random access memory including a plurality of memory cells, each memory cell being connected to a word line and a bit line, and at least one of the input terminals is configured to address a selected memory cell of the functional unit.

5. The integrated circuit of claim 1, wherein the first transistor and the second transistor are dimensioned such that the first and second transistors are switched into the conductive state in the event of discharge and are nonconductive during normal operating mode of the functional unit.

6. The integrated circuit of claim 1, wherein the first and second transistors comprise n-channel field effect transistors.

7. The integrated circuit of claim 1, wherein the first and second transistors comprise p-channel field effect transistors.

8. The integrated circuit of claim 1, wherein the at least one input terminal that applies the supply potential is configured to apply a positive supply potential of a supply voltage.

9. The integrated circuit of claim 1, wherein the first and second transistors of the series circuit are provided with suitable channel length and channel width dimensions such that a voltage of less than 11 V is present when dissipating an electrostatic charge of at least 0.3 μC at the integrated circuit.

10. The integrated circuit of claim 9, wherein the first and second transistors of the series circuit are provided with suitable channel length and channel width dimensions such that the lost current flowing through the series circuit in the normal operating mode of the functional unit is less than a current of 500 μA.

11. The integrated circuit of claim 1, wherein the first and second transistors of the series circuit are provided with suitable channel length and channel width dimensions such that a current of less than 1.3 A flows when dissipating an electrostatic charge of at least 0.3 μC via the series circuit.

12. The integrated circuit of claim 11, wherein the first and second transistors of the series circuit are provided with suitable channel length and channel width dimensions such that the lost current flowing through the series circuit in the normal operating mode of the functional unit is less than a current of 500 μA.

* * * * *